United States Patent
Kapoor et al.

(10) Patent No.: US 8,694,296 B2
(45) Date of Patent: Apr. 8, 2014

(54) METHOD AND APPARATUS FOR INTEGRATED SIMULATION

(75) Inventors: Chetan Kapoor, Austin, TX (US); Peter S. March, Austin, TX (US)

(73) Assignee: Agile Planet, Inc., Austin, TX (US)

( * ) Notice: Subject to any disclaimer, the term of this patent is extended or adjusted under 35 U.S.C. 154(b) by 665 days.

(21) Appl. No.: 12/910,124

(22) Filed: Oct. 22, 2010

(65) Prior Publication Data

US 2012/0101613 A1    Apr. 26, 2012

(51) Int. Cl.
*G06F 17/50* (2006.01)

(52) U.S. Cl.
USPC .......... 703/7; 703/2; 703/13; 703/22; 700/21; 700/97; 700/106; 700/245; 700/248

(58) Field of Classification Search
USPC .......... 703/2, 7, 13; 700/97, 106, 245, 248, 21
See application file for complete search history.

(56) References Cited

U.S. PATENT DOCUMENTS

| | | | | |
|---|---|---|---|---|
| 7,343,222 | B2* | 3/2008 | Solomon | 700/245 |
| 8,112,176 | B2* | 2/2012 | Solomon | 700/245 |
| 2005/0251291 | A1* | 11/2005 | Solomon | 700/245 |
| 2010/0286797 | A1* | 11/2010 | Liu et al. | 700/21 |
| 2010/0286824 | A1* | 11/2010 | Solomon | 700/248 |

* cited by examiner

Primary Examiner — Thai Phan
(74) Attorney, Agent, or Firm — Jeffrey Van Myers; Artie A. Pennington

(57) ABSTRACT

In an automated system which includes a robot manipulator, a workcell, and a control system implemented on a hardware platform based on a programmable logic controller ("PLC"), a method and apparatus for performing integrated simulation that does not require the presence of both the robot manipulator and the workcell. If one component is real, the other component is simulated so as to be sufficiently responsive to responses from the real component such that the real component is unable to discern that the other component is not also real. A computing device simultaneously displays simulacra of both the components, real and simulated, and visualizations of the responses provided by each.

95 Claims, 6 Drawing Sheets

METHOD AND APPARATUS FOR INTEGRATED SIMULATION

BACKGROUND OF THE INVENTION

1. Field of the Invention

The present invention relates generally to a robot control system implemented on a hardware platform based on a programmable logic controller ("PLC") or programmable automation controller ("PAC"), and, in particular, to an integrated simulation and validation platform with a configurable data feedback system.

2. Description of the Related Art

In general, in the descriptions that follow, we will italicize the first occurrence of each special term of art which should be familiar to those skilled in the art of robot control systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well know, consistent system operation can be obtained by reversing the logic sense of all such signals, such that signals described herein as logically true become logically false and vice versa. Furthermore, it is of no relevance in such systems which specific voltage levels are selected to represent each of the logic states.

In general, modern PLCs and PACs are capable of controlling very large workcells or entire production lines. In such applications, the controller must be adapted to interact with the cell equipment using relatively large numbers of separate and distinct input and output ("I/O") signals. Depending on the system requirements, such equipment may comprise not just explicit motion controls, but also a human-machine interface ("HMI"), various environmental or situational sensors, vision, and the like, in a complete integrated package. However, due to limitations in the principle programming languages, such as that defined in IEC 6-1131, conventional PLC/PAC controllers have demonstrated only limited success in motion planning and control of robotic manipulators having multiple degrees of autonomy.

Robotic manipulators are typically used in automated packaging and assembly plants, especially for tasks such as pick and place or container filling operations. In general, robot controllers provide full kinematic support, but only limited support for integrated control environments, often being limited to use in a relatively small workcell having a limited number of I/O signals that must be monitored/managed coincident with the actual robot sensors/controls. Such limitations arise in part due to known deficiencies in the primary controller languages, but also because the programming and maintenance environments tend to be non-homogeneous. As a result, operators usually employ a primary PLC/PAC to control the workcell and, as necessary, to provide relatively high-level, point-to-point motion control commands to a separate robot manipulator controller adapted to translate each motion control command into an appropriate sequence of robot joint motion actions for implementing the requested motion.

In the past, various techniques have been used to develop the control programs required to implement a new workcell or work system. Of particular concern here is the approach employed to 'teach' an integrated robot manipulator the particular sequence of movements required to accomplish the task at hand. One such prior art technique is to manually 'lead-by-the-nose', i.e., to have one person move the robot manipulator (maintained for the duration in a compliant state) through the desired sequence of motions, while another person facilitates the recording of those motions for playback during normal operation. Another popular technique is by using various HMI devices to inform the robot manipulator controller of the desired sequence of movements. In many commercial robot manipulator systems, the vendor will include a teach pendant specially adapted to facilitate this form of teaching.

It has also been proposed to implement wholly off-line programming, wherein models of both the workcell and the robot manipulator can be graphically simulated, simultaneously, thereby allowing, at least in theory, the whole system to be programmed without resort to any physical instantiation. However, this approach is incapable of allowing the simulation to take into consideration the full range and variation of those sensory inputs that would be present in the actual instantiation. Further, no known prior art system of this type is capable of supporting what we refer to as integrated simulation. For example, in some instances, it may be desirable to fully instantiate the workcell and allow it to operate in real time, while, simultaneously, simulating the robot manipulator. Similarly, it may be desirable to fully instantiate the robot manipulator and allow it to operate in real time, while, simultaneously, simulating the workcell. One primary advantage of such an approach is that each of the controller software components—workcell and robot manipulator—are able to execute in as close to a real situation as possible, but without exposing either the workcell or the robot to potential damage. Of course, once both the workcell control component and the robot manipulator control component have been sufficiently debugged, the respective physical instantiations can be simultaneously activated but operating disjoint, i.e., the robot manipulator can be positioned outside of, but adjacent to, the workcell so that the respective, coordinated operations can be simultaneously observed and, as necessary, corrective action taken.

We submit that what is desired, ultimately, is an integrated simulation solution that facilitates safe and efficient development of the software control components of the complete system, including both the workcell equipment and the robot manipulator. In particular, we submit that such a method and apparatus should provide performance generally comparable to the best prior art techniques while requiring less development time than known implementations of such prior art techniques. In addition, such a method and apparatus should facilitate user-configurable real time feedback of data from the motion control software, whether it is connected to real hardware or to a simulator thereof.

BRIEF SUMMARY OF THE INVENTION

In accordance with a preferred embodiment of our invention, we provide an integrated simulation system. The system has an instantiation of a workcell, where the workcell can be either an actual workcell that receives actions and provides responses coupled with a workcell emulator that receives actions and provides a simulacrum as part of its imitating the workcell, or the workcell can be a simulated workcell which models the actual workcell, receiving actions, providing responses, and generating a simulacrum of the workcell. The system also has an instantiation of a robot manipulator, where the robot manipulator can be either an actual robot manipulator that receives actions and provides responses coupled with a robot manipulator emulator that receives actions and provides a simulacrum as part its imitating the robot manipulator, or the robot manipulator can be a simulated robot manipulator which models the actual robot manipulator, receiving actions, providing responses, and generating a simulacrum of the robot manipulator. The system has a computing device which can simultaneously display the simulacrum of the selected workcell instantiation, a first visualization of the response of the selected workcell instantiation, a simulacrum of the selected robot manipulator instantiation, and a second visualization of the response of the selected robot manipulator instantiation. The computing device also receives input from an operator and responds by selectively providing workcell action and robot manipulator action. The system has a programmable logic controller (PLC) containing a workcell controller module which receives the workcell action from the computing device and provides the workcell action to the selected workcell instantiation as well as receiving the responses from the selected workcell instantiation and provides the workcell response to the computing device. Likewise, the PLC contains a robot manipulator controller module which receives the robot manipulator action from the computing device and provides the robot manipulator action to the selected robot manipulator instantiation as well as receiving the response from the selected robot manipulator instantiation and provides the robot manipulator response to the computing device.

In accordance with another preferred embodiment of our invention, we provide a modification of the integrated simulation system as initially described. In this embodiment, the actual workcell and workcell emulator have been removed, leaving only the workcell simulator to represent the workcell within the system. All other components remain as described.

In accordance with another preferred embodiment of our invention, we provide another modification of the integrated simulation system as initially described. In this embodiment, the workcell simulator has been removed, leaving only the actual workcell and workcell emulator to represent the workcell within the system. All other components remain as described.

In accordance with another preferred embodiment of our invention, we provide another modification of the integrated simulation system as initially described. In this embodiment, the actual robot manipulator and robot manipulator emulator have been removed, leaving only the robot manipulator simulator to represent the robot manipulator within the system. All other components remain as described.

In accordance with another preferred embodiment of our invention, we provide another modification of the integrated simulation system as initially described. In this embodiment, the robot manipulator simulator has been removed, leaving only the actual robot manipulator and robot manipulator emulator to represent the robot manipulator within the system. All other components remain as described.

In accordance with another preferred embodiment of our invention, we provide another modification of the integrated simulation system as initially described. In this embodiment, the workcell simulator along with the actual robot manipulator and robot manipulator emulator have been removed, leaving only the actual workcell and workcell emulator along with the robot manipulator simulator to represent their respective components within the system. All other components remain as described.

In accordance with another preferred embodiment of our invention, we provide another modification of the integrated simulation system as initially described. In this embodiment, the actual workcell and workcell emulator along with the robot manipulator simulator have been removed, leaving only the workcell simulator and the actual robot manipulator and robot manipulator simulator to represent their respective components within the system. All other components remain as described.

In accordance with another preferred embodiment of our invention, we provide another modification of the integrated simulation system as initially described. In this embodiment, the actual workcell and workcell emulator along with the actual robot manipulator and robot manipulator emulator have been removed, leaving only the workcell simulator and the robot manipulator simulator to represent their respective components within the system. All other components remain as described.

In accordance with another preferred embodiment of our invention, we provide another modification of the integrated simulation system as initially described. In this embodiment, the workcell emulator and the workcell simulator along with the actual robot manipulator and robot manipulator emulator have been removed, leaving only the actual workcell along with the robot manipulator simulator to represent their respective components within the system. All other components remain as described.

In accordance with another preferred embodiment of our invention, we provide another modification of the integrated simulation system as initially described. In this embodiment, the actual workcell and workcell emulator along with the robot manipulator emulator and robot manipulator simulator have been removed, leaving only the workcell simulator along with the actual robot manipulator to represent their respective components within the system. All other components remain as described.

We submit that this invention provides an integrated simulation solution that facilitates safe and efficient development of the software control components of the complete system, including both the workcell equipment and the robot manipulator. In particular, we submit that such a method and apparatus provides performance generally comparable to the best prior art techniques while requiring less development time than known implementations of such prior art techniques while facilitating user-configurable real time feedback of data from the motion control software, whether it is connected to real hardware or to a simulator thereof.

BRIEF DESCRIPTION OF THE SEVERAL
VIEWS OF THE DRAWINGS

Our invention may be more fully understood by a description of certain preferred embodiments in conjunction with the attached drawings in which.

Figure 1:
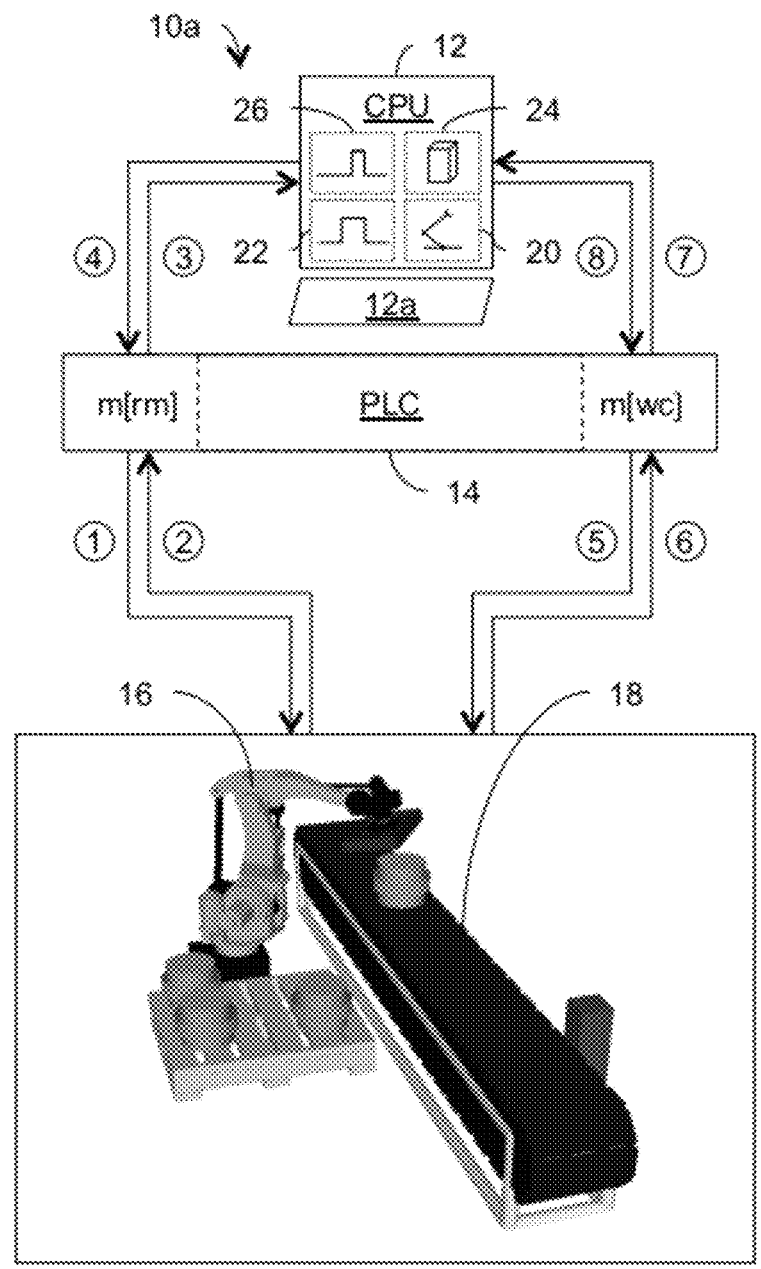
FIG. 1 illustrates, in block diagram form, an integrated simulation system, constructed in accordance with a preferred embodiment of our invention, wherein both the robot manipulator and the workcell are instantiated, and operating conjoint.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

In accordance with the preferred embodiment of our invention, illustrated in FIG. 1, our integrated simulation system 10a includes a computing device 12, a programmable logic controller ("PLC") 14, a robot manipulator 16, and a workcell 18. In general, PLC 14 comprises a plurality of controller modules, m[x]. By way of example, only the robot manipulator controller module, m[rm], and the workcell controller module, m[wc], are illustrated; however, others may be provided on an as-required basis to accommodate more complex systems. As would be expected, either the robot manipulator controller module, m[rm], or the workcell controller module, m[wc], may comprise a plurality of physical controller modules of appropriate functionality depending on the complexity of the system 10a. In addition, as is known, the PLC 14 will typically incorporate a power supply (not shown) and various communication support modules (not shown), such as Ethernet, DeviceNet, and the like.

In the illustrated embodiment 10a, module m[rm] is configured to output actions to robot manipulator 16 (illustrated as transaction 1) and to input responses, e.g., from positional sensors, imagers, proximity sensors, and the like, attached at appropriate locations proximate the several joints of the robot manipulator 16 (transaction 2). In accordance with our invention, module m[rm] is also adapted to output messages to computing device 12 (transaction 3), and to input queries from computing device 12 (transaction 4). In general, each message conveys information relating to actions output to, or sensory signals received from, the robot manipulator 16; whereas each query may selectively request one or more actions by the robot manipulator 16 or data relating to the operating status of the robot manipulator 16 or the several sensors associated therewith.

As illustrated, module m[wc] is configured to output actions to workcell 18 (illustrated as transaction 5) and to input responses, e.g., from positional sensors, imagers, proximity sensors, and the like, attached at appropriate locations proximate the several operating components of the workcell 18 (transaction 6). In accordance with our invention, module m[wc] is also adapted to output messages to computing device 12 (transaction 7), and to input queries from computing device 12 (transaction 8). In general, each message conveys information relating to actions output to, or sensory signals received from, the workcell 18; whereas each query may selectively request one or more actions by the workcell 18 or data relating to the operating status of the workcell 18 or the several sensors associated therewith.

In accordance with our invention, the computing device 12 is adapted to selectively execute several software modules specially designed to implement our integrated simulation environment. For convenience of reference, we have illustrated simultaneous operation of only four (4) separate and distinct display modules, each programmatically generating a respective view. For example, in view 20, a visualization of the operating condition of the robot manipulator 16 is displayed, while, substantially simultaneously, in view 22, any of a number of different visualizations may be displayed, each representing a selected sensory input or set of sensory inputs associated with the robot manipulator 16 (see, transactions 2 and 3). Further, in view 24, a visualization of the operating condition of the workcell 18 is displayed, while, substantially simultaneously, in view 26, any of a number of different visualizations may be displayed, each representing a selected sensory input or set of sensory inputs associated with the workcell 18 (see, transactions 6 and 7). Thus, it can be seen that our integrated simulation environment allows simultaneous visualization of substantially all of the pertinent factors associated with the coordinated operations of both the robot manipulator 16 and workcell 18. However, it will ordinarily require substantial effort to arrive at this point in the development cycle. It is here that our invention is of special utility.

Figure 2:
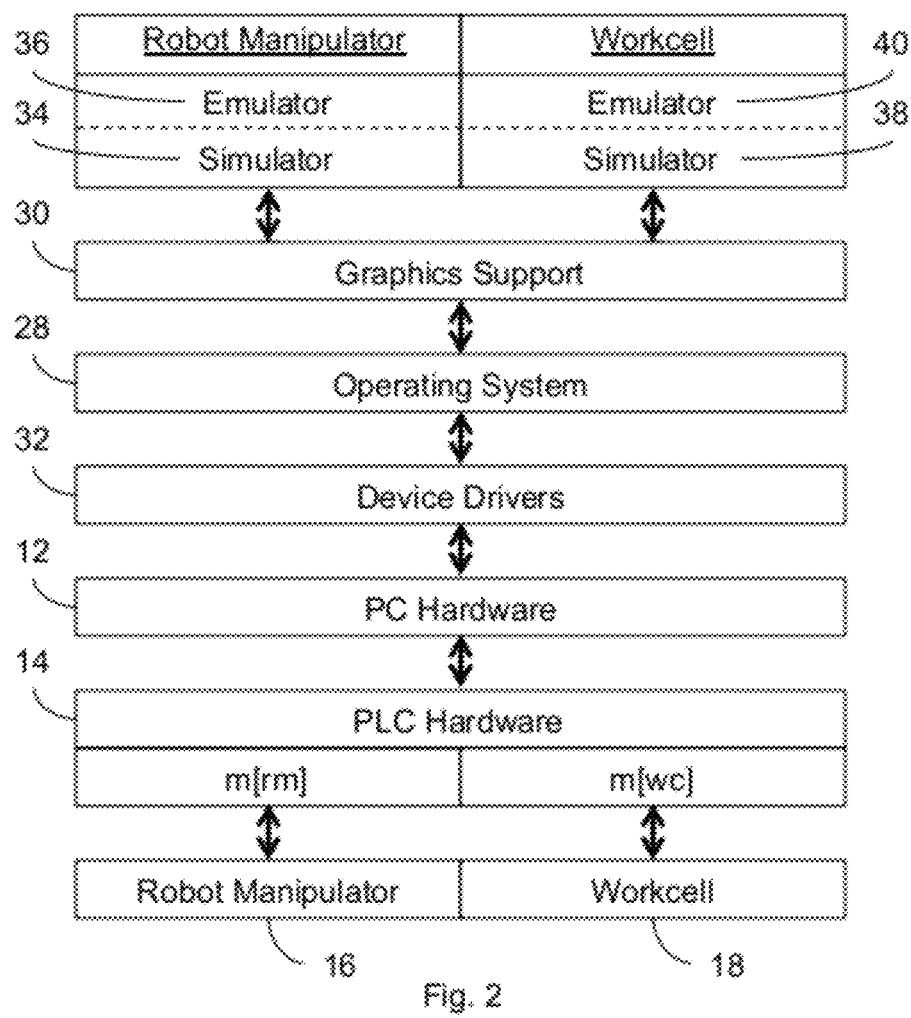
FIG. 2 illustrates, in flow diagram form, a combined hardware/software control system in accordance with our invention.

As shown in FIG. 2, the several hardware and software components essential to implementing our integrated simulation environment include both standard and custom components. For purposes of describing our invention, we intend the term simulator to mean a software component that is specially adapted to model the behavior of a respective, non-physically implemented hardware component (and any embedded software component); and the term emulator to mean a software component that is specially adapted to imitate the behavior of a respective, physically instantiated hardware component (and any embedded software component). Thus, for example, our simulator is designed such that it accepts as its inputs the control and system status information ordinarily required for the operation of the simulated component, and, in response, generates responses consistent with the resulting operation of the simulated component; in accordance with our invention, our simulator also generates a visual simulacrum that, to an observer, appears to replicate the behavior of the simulated component. In contrast, our emulator is designed such that it accepts as its inputs information from the emulated component that completely describes the behavior of the emulated component, and, in response, generates a visual simulacrum that, to an observer, appears to replicate the behavior of the emulated component. The end result is that our simulator (and, indirectly, its visualized simulacrum) appears to the rest of the system (and to the observer) to be a fully functional substitute for the simulated component, whereas our emulator simply produces a simulacrum that visually mimics the behavior of the emulated component.

By way of example, we have illustrated the following software components commonly found in a personal computer (or workstation): operating system 28, e.g., UNIX/Linux, Microsoft's Windows®, or Apple's Mac OSX®; graphics support package 30; and low-level device drivers 32. Also by way of example, we have illustrated the following software components that must be customized to each particular system 10: a robot manipulator simulator 34 and emulator 36, as described hereinafter; and a workcell simulator 38 and emulator 40, also as described hereinafter. Illustrated hardware components include: standard PC or workstation hardware 12; the required PLC hardware 14; the selected robot manipulator 16; and the selected workcell 18.

Figure 3:
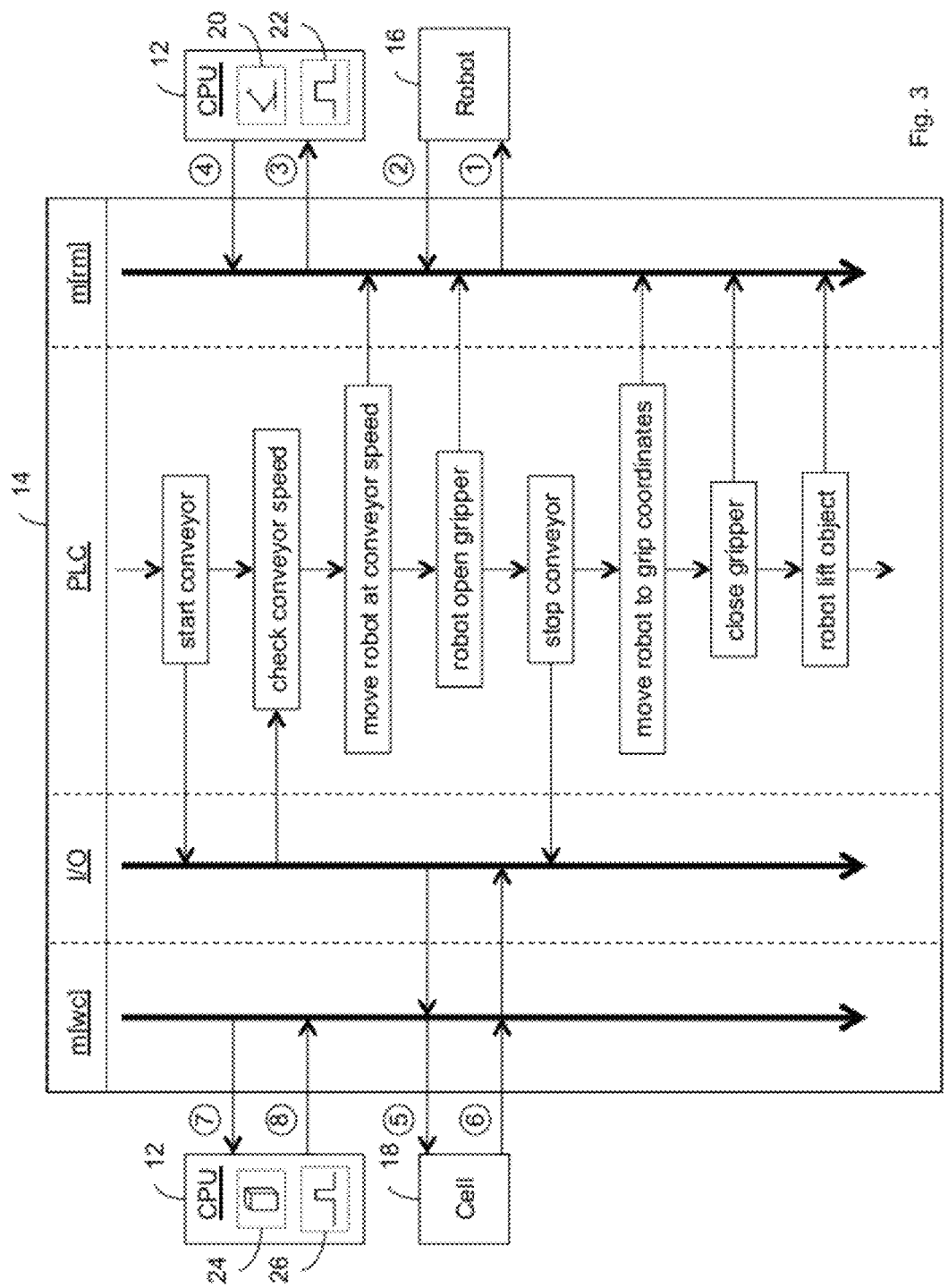
FIG. 3 illustrates, in parallel time flow diagram flow, a typical sequence of coordinated movements of the robot manipulator and workcell.

As illustrated in FIG. 3, our integrated simulation system 10a is adapted to develop the several views 20-26 using the respective components of the PLC 14. In accordance with the illustrated short sequence of operating commands executed by the PLC modules, the robot manipulator 16 and workcell 18 perform coordinated actions intended to accomplish required steps in the overall process flow. Simultaneously, CPU generates and displays the several views 20-26, thereby allowing the operator dynamically to monitor the actual movements of the system components. In accordance with our invention, simulator module 34 may be substituted for the robot manipulator 16, or simulator module 38 may be substituted for the workcell 18, or both, without substantially changing the experience of the operator.

Using conventional modular programming constructs, it may be possible and, indeed desirable, to implement the simulator [34, 38] and emulator [36, 40] components such that they share as much functionality as possible. It is possible that a majority of the I/O elements and the visualization elements can be implemented in the form of a shared library; in the extreme, such an approach may result in most, if not all, of the emulation functionality being fully shared with the simulator, leaving only the modeling elements for implementation in the simulator per se. Thus, for example, each of the emulators [36, 40] may be implemented as a conditional sequence of calls to the library, while the corresponding simulators [34, 38] may each be implemented as a relatively high-level model that conditionally calls the library for lower-level support routines. As will be evident, even though the simulacra of the robot manipulator 16 and the workcell 18 are, visually, quite different, the processes for visualizing each rely on the same set of shared rendering routines; similarly, it may also be possible to share the I/O processes between all of the simulators [34, 38] and emulators [36, 40].

Figure 4:
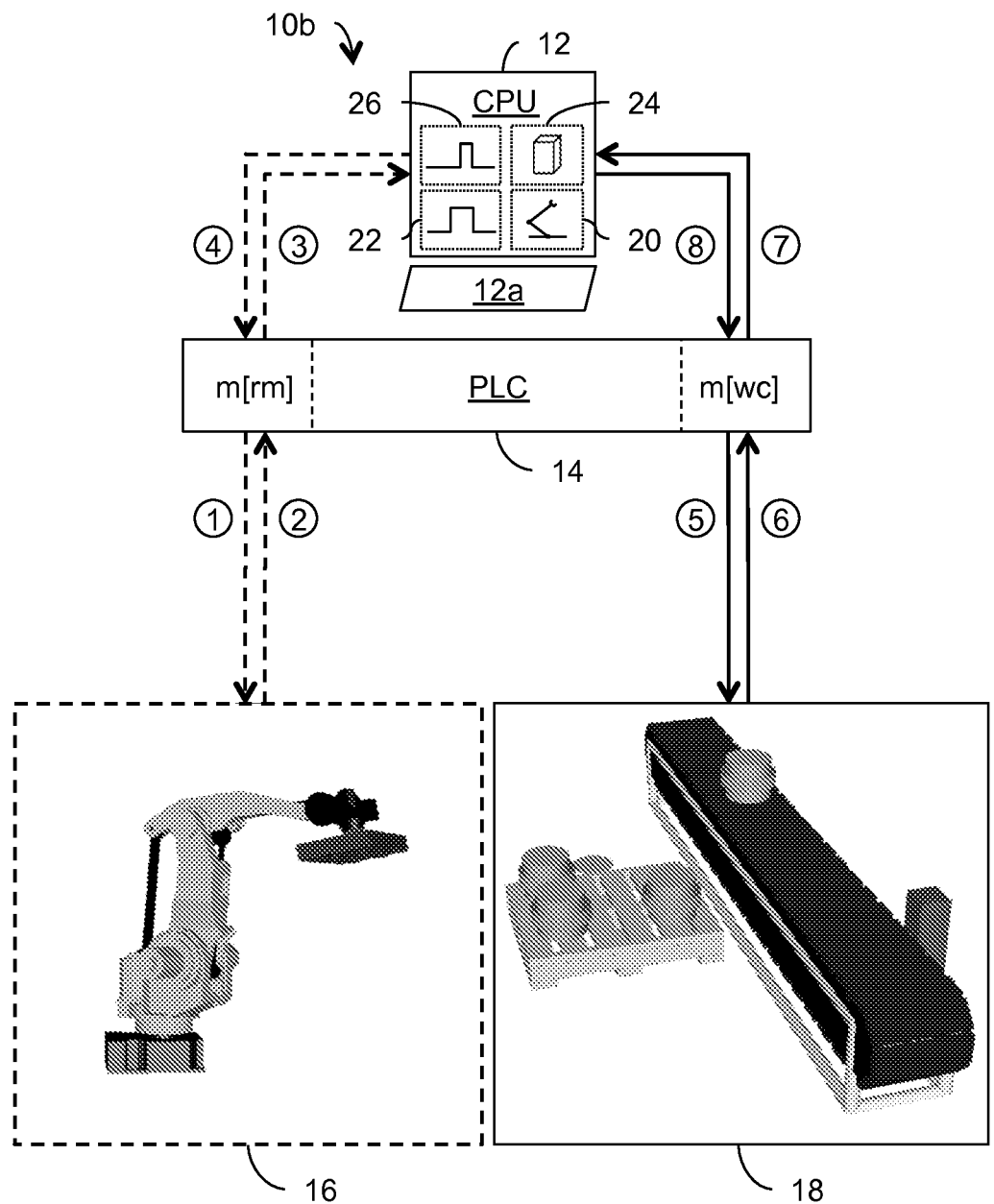
FIG. 4 illustrates, in block diagram form, an integrated simulation system, constructed in accordance with a preferred embodiment of our invention, wherein the workcell is instantiated and the robot manipulator is simulated.

In the embodiment 10b, illustrated in FIG. 4, only the workcell 18 is physically instantiated—the robot manipulator 16 is not. Rather, using conventional visualization techniques known in the graphic arts, the robot manipulator simulator module may employ view 20 to display a simulacra of robot manipulator 16, while, in parallel, the workcell emulator module may employ view 24 to display a simulacrum of workcell 18. Using conventional user interface devices, such as keyboard 12a or any of a number of different pointing devices (not shown), a human operator is empowered to issue programming instructions to the robot manipulator simulator module to effect desired movements of the robot manipulator simulacra, such movements being visualized in view 20. As and to the extent necessary, the robot manipulator simulator module may be adapted to cooperate with the workcell emulator module so as to interact with the workcell control module m[wc] (see, transactions 7 and 8) sufficiently realistically that, insofar as the module m[wc] can discern, the robot manipulator 16 is, in fact, physically instantiated. For example, since there is no physically instantiated robot manipulator, those sensory signals normally available, e.g., joint torque, must be estimated using known physical characteristics of the real robot manipulator, including limb dimensions, mass distribution, and the like. In response, as workcell 18 progresses through its normal sequence of operations (preferably at less than normal speed), the responses received by the workcell emulator module from the workcell 18 (see, transactions 6 and 7) may be displayed in near real-time, thereby allowing the operator to 'teach' the robot manipulator simulator module substantially as effectively as if the robot manipulator 16 was indeed physically instantiated. Such an approach would be of significant value in situations where the workcell 18 is in existence but the robot manipulator 16 is still in design (or pending production/delivery).

Figure 5:
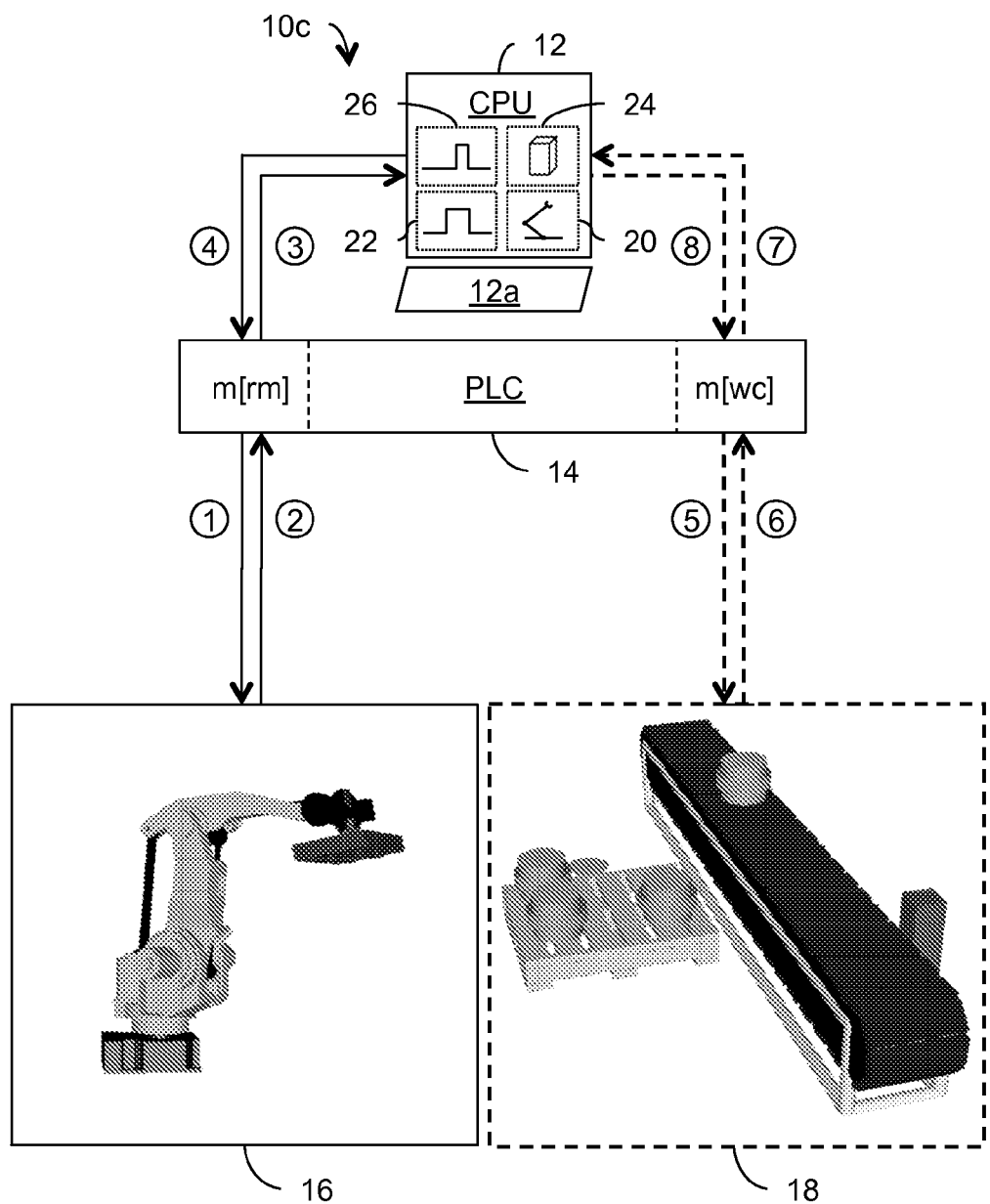
FIG. 5 illustrates, in block diagram form, an integrated simulation system, constructed in accordance with a preferred embodiment of our invention, wherein the robot manipulator is instantiated and the workcell is simulated.

In the embodiment 10c, illustrated in FIG. 5, only the robot manipulator 16 is physically instantiated—the workcell 18 is not. Rather, using conventional visualization techniques known in the graphic arts, the workcell simulator module may employ view 24 to display the simulacrum of workcell 18, while, in parallel, the robot manipulator emulator module may employ view 20 to display a simulacrum of robot manipulator 16. Using conventional user interface devices, such as keyboard 12a or any of a number of different pointing devices (not shown), the human operator is empowered to issue programming instructions to the workcell simulator module to effect desired operations of the workcell simulacra, such operations being visualized in view 24. As and to the extent necessary, the workcell simulator module may be adapted to cooperate with the robot manipulator emulator module so as to interact with the robot manipulator control module m[rm] (see, transactions 3 and 4) sufficiently realistically that, insofar as the module m[rm] can discern, the workcell 18 is, in fact, physically instantiated. In response, as robot manipulator 16 progresses through its normal sequence of operations (preferably at less than normal speed), the responses received by the workcell simulator module from the robot manipulator 16 (see, transactions 2 and 3) may be displayed in near real-time, thereby allowing the operator to 'teach' the workcell simulator module substantially as effectively as if the workcell 18 was indeed physically instantiated. Such an approach would be of significant value in situations where the robot manipulator 16 is in existence but the workcell 18 is still in design (or pending production/delivery).

Figure 6:
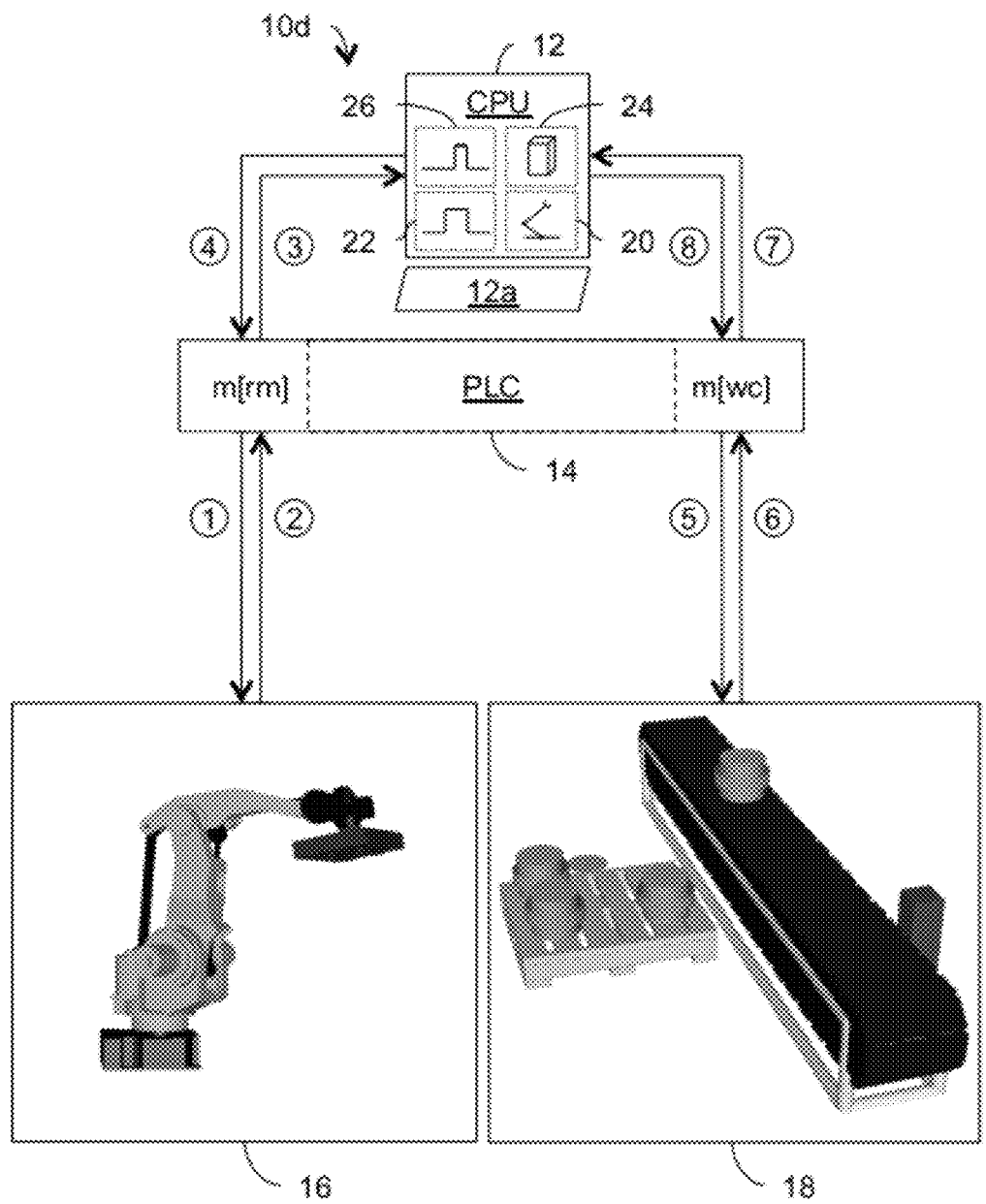
FIG. 6 illustrates, in block diagram form, an integrated simulation system, constructed in accordance with a preferred embodiment of our invention, wherein both the robot manipulator and the workcell are instantiated, but operating disjoint.

In the embodiment 10d, illustrated in FIG. 6, both the robot manipulator 16 and the workcell 18 are instantiated, but are physically arranged for disjoint operation. In this arrangement, using conventional visualization techniques known in the graphic arts, our robot manipulator emulator module may employ view 20 to display the simulacrum of robot manipulator 16, while, simultaneously, our workcell emulator module employs view 24 to display the simulacrum of workcell 18. Using conventional user interface devices, such as keyboard 12a or any of a number of different pointing devices (not shown), the human operator is now empowered to issue robot sequencing actions via the robot manipulator emulator module to the robot manipulator control module m[rm] (see, transaction 4) so as to effect corresponding movement of the robot manipulator 16. Substantially simultaneously, the operator is empowered to issue workcell sequencing actions via the workcell emulator module to the workcell control module m[wc] (see, transaction 8) so as to effect corresponding operation of the workcell 18. As robot manipulator 16 and workcell 18 progress through their respective normal sequences of operations (preferably at less than normal speed), the responses received by the robot manipulator emulator module from the robot manipulator 16 (see, transactions 2 and 3) and the feedback received by the workcell emulator module from the workcell 18 (see, transactions 6 and 7) may be displayed in near real-time, thereby allowing the operator to observe the respective movements/operations of both the robot manipulator 16 and the workcell 18. Such an approach would be of significant value as a common sense checkpoint in the system development cycle prior to the initial conjoint operation of the robot manipulator 16 and workcell 18 (see, FIG. 1).

As will be evident to those skilled in the art, our integrated simulation environment may be practiced in other prior robotic automation systems. As is known, each embodiment will typically include additional conventional components, additional conventional robotic manipulators, or may be controlled by any number of PLC systems, PAC systems, or the like. Although it may be sufficient for some environments to visualize the robot manipulator 16 and the workcell 18 using simple 2-dimensional stick figures, we prefer to use more sophisticated rendering techniques so as to visualize these components in a 3-dimensional format. In such an embodiment, we would also recommend empowering the operator to selectively rotate (and, perhaps, to pan and/or zoom) each of the simulacra, so as to facilitate fuller comprehension of all physical aspects of the rendered scenes.

In accordance with our invention, each of the simulators may be instantiated in the respective PLC hardware module generally associated with the respective hardware component. Thus, for example, in one embodiment, the robot manipulator simulator may be integrated into the normal control software of the robot manipulator control module m[rm]. Alternatively, in another embodiment, the work cell simulator may be integrated into the normal control software of the work cell control module m[wc]. Of course, if desired, both simulators can be so integrated into the respective PLC hardware control modules. In these configurations, the CPU 12 would only be responsible for rendering of the respective simulacra in views 20 and 24, and related user-configurable real time feedback data in views 22 and 26.

If the PLC hardware is sufficiently powerful, it is entirely possible, and indeed desirable, to construct the main controller code such that the simulation functionality is tightly integrated with the hardware control functionality. For example, in such an instantiation, a code sequence responsible for generating a particular hardware action might also be adapted selectively to simulate the response(s) normally generated by the hardware in response to the action. During normal operation, i.e., when the hardware component is instantiated, the other system components will receive real responses; during simulated operation, i.e., when the simulator is instantiated, the other system components will receive simulated responses. In either case, only the respective PLC hardware component need be aware of which instantiation is active. From a systems perspective, such an instantiation provides a simulation environment having very high fidelity to the real environment, thereby greatly facilitating development of the end user application.

Thus it is apparent that we have provided an integrated simulation solution that facilitates safe and efficient development of the software control components of the complete system, including both the workcell equipment and the robot manipulator. In particular, we submit that our method and apparatus provides performance generally comparable to the best prior art techniques while requiring less development time than known implementations of such prior art techniques. Those skilled in the art will recognize that modifications and variations can be made without departing from the spirit of our invention. Therefore, we intend that our invention encompass all such variations and modifications as fall within the scope of the appended claims.

What we claim is:

1. An integrated simulation system comprising:
   an instantiation of a workcell comprising a selected one of:
      both:
         a workcell adapted to:
            receive a workcell action; and
            provide a workcell response; and
         a workcell emulator adapted to imitate said workcell and to:
            receive said workcell action; and
            generate a simulacrum of said workcell; and
      a workcell simulator adapted to model said workcell and to:
         receive said workcell action;
         provide a simulated workcell response; and
         generate said simulacrum of said workcell;
   an instantiation of a robot manipulator comprising a selected one of:
      both:
         a robot manipulator adapted to:
            receive a robot manipulator action; and
            provide a robot manipulator response; and
         a robot manipulator emulator adapted to imitate said robot manipulator and to:
            receive said robot manipulator action; and
            generate a simulacrum of said robot manipulator; and
      a robot manipulator simulator adapted to model said robot manipulator and to:
         receive said robot manipulator action;
         provide a simulated robot manipulator response; and
         generate said simulacrum of said robot manipulator;
   a computing device adapted to:
      simultaneously display:
         said simulacrum of said selected workcell instantiation;
         a first visualization of said response of said selected workcell instantiation;
         said simulacrum of said selected robot manipulator instantiation; and
         a second visualization of said response of said selected robot manipulator instantiation; and
      receive input from an operator, and, in response thereto, selectively provide said workcell action and said robot manipulator action; and
   a programmable logic controller (PLC) comprising:
      a workcell controller module adapted to:
         receive said workcell action from said computing device, and, in response, provide said workcell action to said selected workcell instantiation; and
         receive said response from said selected workcell instantiation, and, in response, provide said workcell response to said computing device; and
      a robot manipulator controller module adapted to:
         receive said robot manipulator action from said computing device, and, in response, provide said robot manipulator action to said selected robot manipulator instantiation; and
         receive said response from said selected robot manipulator instantiation, and, in response, provide said robot manipulator response to said computing device.

2. The system of claim 1 wherein said workcell emulator is a software component executing on said PLC.

3. The system of claim 2 wherein said robot manipulator emulator is a software component executing on said PLC.

4. The system of claim 2 wherein said robot manipulator emulator is a software component executing on said computing device.

5. The system of claim 2 wherein said robot manipulator simulator is a software component executing on said PLC.

6. The system of claim 1 wherein said workcell emulator is a software component executing on said computing device.

7. The system of claim 6 wherein said robot manipulator emulator is a software component executing on said PLC.

8. The system of claim 6 wherein said robot manipulator emulator is a software component executing on said computing device.

9. The system of claim 6 wherein said robot manipulator simulator is a software component executing on said PLC.

10. The system of claim 1 wherein said workcell simulator is a software component executing on said PLC.

11. The system of claim 10 wherein said robot manipulator emulator is a software component executing on said PLC.

12. The system of claim 10 wherein said robot manipulator emulator is a software component executing on said computing device.

13. The system of claim 10 wherein said robot manipulator simulator is a software component executing on said PLC.

14. The system of claim 1 wherein said workcell simulator is a software component executing on said computing device.

15. The system of claim 14 wherein said robot manipulator emulator is a software component executing on said PLC.

16. The system of claim 14 wherein said robot manipulator emulator is a software component executing on said computing device.

17. The system of claim 14 wherein said robot manipulator simulator is a software component executing on said PLC.

18. The system of claim 1 wherein said robot manipulator emulator is a software component executing on said PLC.

19. The system of claim 1 wherein said robot manipulator emulator is a software component executing on said computing device.

20. The system of claim 1 wherein said robot manipulator simulator is a software component executing on said PLC.

21. An integrated simulation system comprising:
   an instantiation of a workcell comprising:
      a workcell simulator adapted to model said workcell and to:
         receive a workcell action;
         provide a simulated workcell response; and
         generate a simulacrum of said workcell;
   an instantiation of a robot manipulator comprising a selected one of:
      both:
         a robot manipulator adapted to:
            receive a robot manipulator action; and
            provide a robot manipulator response; and
         a robot manipulator emulator adapted to imitate said robot manipulator and to:
            receive said robot manipulator action; and
            generate a simulacrum of said robot manipulator; and
      a robot manipulator simulator adapted to model said robot manipulator and to:
         receive said robot manipulator action;
         provide a simulated robot manipulator response; and
         generate said simulacrum of said robot manipulator;
   a computing device adapted to:
      simultaneously display:
         said simulacrum of said workcell instantiation;
         a first visualization of said response of said workcell instantiation;
         said simulacrum of said selected robot manipulator instantiation; and
         a second visualization of said response of said selected robot manipulator instantiation; and
      receive input from an operator, and, in response thereto, selectively provide said workcell action and said robot manipulator action; and
   a programmable logic controller (PLC) comprising:
      a workcell controller module adapted to:
         receive said workcell action from said computing device, and, in response, provide said workcell action to said workcell instantiation; and
         receive said response from said workcell instantiation, and, in response, provide said workcell response to said computing device; and
      a robot manipulator controller module adapted to:
         receive said robot manipulator action from said computing device, and, in response, provide said robot manipulator action to said selected robot manipulator instantiation; and
         receive said response from said selected robot manipulator instantiation, and, in response, provide said robot manipulator response to said computing device.

22. The system of claim 21 wherein said workcell simulator is a software component executing on said PLC.

23. The system of claim 22 wherein said robot manipulator emulator is a software component executing on said PLC.

24. The system of claim 22 wherein said robot manipulator emulator is a software component executing on said computing device.

25. The system of claim 22 wherein said robot manipulator simulator is a software component executing on said PLC.

26. The system of claim 21 wherein said workcell simulator is a software component executing on said computing device.

27. The system of claim 26 wherein said robot manipulator emulator is a software component executing on said PLC.

28. The system of claim 26 wherein said robot manipulator emulator is a software component executing on said computing device.

29. The system of claim 26 wherein said robot manipulator simulator is a software component executing on said PLC.

30. The system of claim 21 wherein said robot manipulator emulator is a software component executing on said PLC.

31. The system of claim 21 wherein said robot manipulator emulator is a software component executing on said computing device.

32. The system of claim 21 wherein said robot manipulator simulator is a software component executing on said PLC.

33. An integrated simulation system comprising:
   an instantiation of a workcell comprising:
      both:
         a workcell adapted to:
            receive a workcell action; and
            provide a workcell response; and
         a workcell emulator adapted to imitate said workcell and to:
            receive said workcell action; and
            generate a simulacrum of said workcell; and
   an instantiation of a robot manipulator comprising a selected one of:
      both:
         a robot manipulator adapted to:
            receive a robot manipulator action; and
            provide a robot manipulator response; and
         a robot manipulator emulator adapted to imitate said robot manipulator and to:
            receive said robot manipulator action; and
            generate a simulacrum of said robot manipulator; and
      a robot manipulator simulator adapted to model said robot manipulator and to:
         receive said robot manipulator action;
         provide a simulated robot manipulator response; and
         generate said simulacrum of said robot manipulator;
   a computing device adapted to:
      simultaneously display:
         said simulacrum of said workcell instantiation;

a first visualization of said response of said workcell instantiation;
said simulacrum of said selected robot manipulator instantiation; and
a second visualization of said response of said selected robot manipulator instantiation; and
receive input from an operator, and, in response thereto, selectively provide said workcell action and said robot manipulator action; and
a programmable logic controller (PLC) comprising:
a workcell controller module adapted to:
receive said workcell action from said computing device, and, in response, provide said workcell action to said workcell instantiation; and
receive said response from said workcell instantiation, and, in response, provide said workcell response to said computing device; and
a robot manipulator controller module adapted to:
receive said robot manipulator action from said computing device, and, in response, provide said robot manipulator action to said selected robot manipulator instantiation; and
receive said response from said selected robot manipulator instantiation, and, in response, provide said robot manipulator response to said computing device.

34. The system of claim 33 wherein said workcell emulator is a software component executing on said PLC.

35. The system of claim 34 wherein said robot manipulator emulator is a software component executing on said PLC.

36. The system of claim 34 wherein said robot manipulator emulator is a software component executing on said computing device.

37. The system of claim 34 wherein said robot manipulator simulator is a software component executing on said PLC.

38. The system of claim 33 wherein said workcell emulator is a software component executing on said computing device.

39. The system of claim 38 wherein said robot manipulator emulator is a software component executing on said PLC.

40. The system of claim 38 wherein said robot manipulator emulator is a software component executing on said computing device.

41. The system of claim 38 wherein said robot manipulator simulator is a software component executing on said PLC.

42. The system of claim 33 wherein said robot manipulator emulator is a software component executing on said PLC.

43. The system of claim 33 wherein said robot manipulator emulator is a software component executing on said computing device.

44. The system of claim 33 wherein said robot manipulator simulator is a software component executing on said PLC.

45. An integrated simulation system comprising:
an instantiation of a workcell comprising a selected one of: both:
a workcell adapted to:
receive a workcell action; and
provide a workcell response; and
a workcell emulator adapted to imitate said workcell and to:
receive said workcell action; and
generate a simulacrum of said workcell; and
a workcell simulator adapted to model said workcell and to:
receive said workcell action;
provide a simulated workcell response; and
generate said simulacrum of said workcell; and
an instantiation of a robot manipulator comprising:
a robot manipulator simulator adapted to model said robot manipulator and to:
receive a robot manipulator action;
provide a simulated robot manipulator response; and
generate a simulacrum of said robot manipulator;
a computing device adapted to:
simultaneously display:
said simulacrum of said selected workcell instantiation;
a first visualization of said response of said selected workcell instantiation;
said simulacrum of said robot manipulator instantiation; and
a second visualization of said response of said robot manipulator instantiation; and
receive input from an operator, and, in response thereto, selectively provide said workcell action and said robot manipulator action; and
a programmable logic controller (PLC) comprising:
a workcell controller module adapted to:
receive said workcell action from said computing device, and, in response, provide said workcell action to said selected workcell instantiation; and
receive said response from said selected workcell instantiation, and, in response, provide said workcell response to said computing device; and
a robot manipulator controller module adapted to:
receive said robot manipulator action from said computing device, and, in response, provide said robot manipulator action to said robot manipulator instantiation; and
receive said response from said robot manipulator instantiation, and, in response, provide said robot manipulator action to said computing device.

46. The system of claim 45 wherein said workcell emulator is a software component executing on said PLC.

47. The system of claim 46 wherein said robot manipulator simulator is a software component executing on said PLC.

48. The system of claim 45 wherein said workcell emulator is a software component executing on said computing device.

49. The system of claim 48 wherein said robot manipulator simulator is a software component executing on said PLC.

50. The system of claim 45 wherein said workcell simulator is a software component executing on said PLC.

51. The system of claim 50 wherein said robot manipulator simulator is a software component executing on said PLC.

52. The system of claim 45 wherein said workcell simulator is a software component executing on said computing device.

53. The system of claim 52 wherein said robot manipulator simulator is a software component executing on said PLC.

54. The system of claim 45 wherein said robot manipulator simulator is a software component executing on said PLC.

55. An integrated simulation system comprising:
an instantiation of a workcell comprising a selected one of: both:
a workcell adapted to:
receive a workcell action; and
provide a workcell response; and
a workcell emulator adapted to imitate said workcell and to:
receive said workcell action; and
generate a simulacrum of said workcell; and
a workcell simulator adapted to model said workcell and to:
receive said workcell action;
provide a simulated workcell response; and generate said simulacrum of said workcell;
an instantiation of a robot manipulator comprising:
both:
a robot manipulator adapted to:
receive a robot manipulator action; and
provide a robot manipulator response; and
a robot manipulator emulator adapted to imitate said robot manipulator and to:
receive said robot manipulator action; and
generate a simulacrum of said robot manipulator; and
a computing device adapted to:
simultaneously display:
said simulacrum of said selected workcell instantiation;
a first visualization of said response of said selected workcell instantiation;
said simulacrum of said robot manipulator instantiation; and
a second visualization of said response of said robot manipulator instantiation; and
receive input from an operator, and, in response thereto, selectively provide said workcell action and said robot manipulator action; and
a programmable logic controller (PLC) comprising:
a workcell controller module adapted to:
receive said workcell action from said computing device, and, in response, provide said workcell action to said selected workcell instantiation; and
receive said response from said selected workcell instantiation, and, in response, provide said workcell response to said computing device; and
a robot manipulator controller module adapted to:
receive said robot manipulator action from said computing device, and, in response, provide said robot manipulator action to said robot manipulator instantiation; and
receive said response from said robot manipulator instantiation, and, in response, provide said robot manipulator response to said computing device.

56. The system of claim 55 wherein said workcell emulator is a software component executing on said PLC.

57. The system of claim 56 wherein said robot manipulator emulator is a software component executing on said PLC.

58. The system of claim 56 wherein said robot manipulator emulator is a software component executing on said computing device.

59. The system of claim 55 wherein said workcell emulator is a software component executing on said computing device.

60. The system of claim 59 wherein said robot manipulator emulator is a software component executing on said PLC.

61. The system of claim 59 wherein said robot manipulator emulator is a software component executing on said computing device.

62. The system of claim 55 wherein said workcell simulator is a software component executing on said PLC.

63. The system of claim 62 wherein said robot manipulator emulator is a software component executing on said PLC.

64. The system of claim 62 wherein said robot manipulator emulator is a software component executing on said computing device.

65. The system of claim 55 wherein said workcell simulator is a software component executing on said computing device.

66. The system of claim 65 wherein said robot manipulator emulator is a software component executing on said PLC.

67. The system of claim 65 wherein said robot manipulator emulator is a software component executing on said computing device.

68. The system of claim 55 wherein said robot manipulator emulator is a software component executing on said PLC.

69. The system of claim 55 wherein said robot manipulator emulator is a software component executing on said computing device.

70. An integrated simulation system comprising:
an instantiation of a workcell comprising:
both:
a workcell adapted to:
receive a workcell action; and
provide a workcell response; and
a workcell emulator adapted to imitate said workcell and to:
receive said workcell action; and
generate a simulacrum of said workcell; and
an instantiation of a robot manipulator comprising:
a robot manipulator simulator adapted to model said robot manipulator and to:
receive a robot manipulator action;
provide a simulated robot manipulator response; and
generate a simulacrum of said robot manipulator;
a computing device adapted to:
simultaneously display:
said simulacrum of said workcell instantiation;
a first visualization of said response of said workcell instantiation;
said simulacrum of said robot manipulator instantiation; and
a second visualization of said response of said robot manipulator instantiation; and
receive input from an operator, and, in response thereto, selectively provide said workcell action and said robot manipulator action; and
a programmable logic controller (PLC) comprising:
a workcell controller module adapted to:
receive said workcell action from said computing device, and, in response, provide said workcell action to said workcell instantiation; and
receive said response from said workcell instantiation, and, in response, provide said workcell response to said computing device; and
a robot manipulator controller module adapted to:
receive said robot manipulator action from said computing device, and, in response, provide said robot manipulator action to said robot manipulator instantiation; and
receive said response from said robot manipulator instantiation, and, in response, provide said robot manipulator response to said computing device.

71. The system of claim 70 wherein said workcell emulator is a software component executing on said PLC.

72. The system of claim 71 wherein said robot manipulator simulator is a software component executing on said PLC.

73. The system of claim 70 wherein said workcell emulator is a software component executing on said computing device.

74. The system of claim 73 wherein said robot manipulator simulator is a software component executing on said PLC.

75. The system of claim 70 wherein said robot manipulator simulator is a software component executing on said PLC.

76. An integrated simulation system comprising:
an instantiation of a workcell comprising:
a workcell simulator adapted to model said workcell and to:
receive a workcell action;

provide a simulated workcell response; and
generate a simulacrum of said workcell;
an instantiation of a robot manipulator comprising:
both:
a robot manipulator adapted to:
receive a robot manipulator action; and
provide a robot manipulator response; and
a robot manipulator emulator adapted to imitate said robot manipulator and to:
receive said robot manipulator action;
generate a simulacrum of said robot manipulator; and
a computing device adapted to:
simultaneously display:
said simulacrum of said workcell instantiation;
a first visualization of said response of said workcell instantiation;
said simulacrum of said robot manipulator instantiation; and
a second visualization of said response of said robot manipulator instantiation; and
receive input from an operator, and, in response thereto, selectively provide said workcell action and said robot manipulator action; and
a programmable logic controller (PLC) comprising:
a workcell controller module adapted to:
receive said workcell action from said computing device, and, in response, provide said workcell action to said workcell instantiation; and
receive said response from said workcell instantiation, and, in response, provide said workcell response to said computing device; and
a robot manipulator controller module adapted to:
receive said robot manipulator action from said computing device, and, in response, provide said robot manipulator action to said robot manipulator instantiation; and
receive said response from said robot manipulator instantiation, and, in response, provide said robot manipulator response to said computing device.

77. The system of claim 76 wherein said workcell simulator is a software component executing on said PLC.

78. The system of claim 77 wherein said robot manipulator emulator is a software component executing on said PLC.

79. The system of claim 77 wherein said robot manipulator emulator is a software component executing on said computing device.

80. The system of claim 76 wherein said workcell simulator is a software component executing on said computing device.

81. The system of claim 80 wherein said robot manipulator emulator is a software component executing on said PLC.

82. The system of claim 80 wherein said robot manipulator emulator is a software component executing on said computing device.

83. The system of claim 76 wherein said robot manipulator emulator is a software component executing on said PLC.

84. The system of claim 76 wherein said robot manipulator emulator is a software component executing on said computing device.

85. An integrated simulation system comprising:
an instantiation of a workcell comprising:
a workcell simulator adapted to model said workcell and to:
receive a workcell action;
provide a simulated workcell response; and
generate a simulacrum of said workcell;
an instantiation of a robot manipulator comprising:
a robot manipulator simulator adapted to model said robot manipulator and to:
receive a robot manipulator action;
provide a simulated robot manipulator response; and
generate a simulacrum of said robot manipulator;
a computing device adapted to:
simultaneously display:
said simulacrum of said workcell instantiation;
a first visualization of said response of said workcell instantiation;
said simulacrum of said robot manipulator instantiation; and
a second visualization of said response of said robot manipulator instantiation; and
receive input from an operator, and, in response thereto, selectively provide said workcell action and said robot manipulator action; and
a programmable logic controller (PLC) comprising:
a workcell controller module adapted to:
receive said workcell action from said computing device, and, in response, provide said workcell action to said workcell instantiation; and
receive said response from said workcell instantiation, and, in response, provide said workcell response to said computing device; and
a robot manipulator controller module adapted to:
receive said robot manipulator action from said computing device, and, in response, provide said robot manipulator action to said robot manipulator instantiation; and
receive said response from said robot manipulator instantiation, and, in response, provide said robot manipulator action to said computing device.

86. The system of claim 85 wherein said workcell simulator is a software component executing on said PLC.

87. The system of claim 86 wherein said robot manipulator simulator is a software component executing on said PLC.

88. The system of claim 85 wherein said workcell simulator is a software component executing on said computing device.

89. The system of claim 88 wherein said robot manipulator simulator is a software component executing on said PLC.

90. The system of claim 85 wherein said robot manipulator simulator is a software component executing on said PLC.

91. An integrated simulation system comprising:
an instantiation of a workcell comprising:
a workcell adapted to:
receive a workcell action; and
provide a workcell response; and
an instantiation of a robot manipulator comprising:
a robot manipulator simulator adapted to model said robot manipulator and to:
receive said robot manipulator action;
provide a simulated robot manipulator response; and
generate said simulacrum of said robot manipulator;
a computing device adapted to:
simultaneously display:
a first visualization of said response of said workcell instantiation;
said simulacrum of said robot manipulator instantiation; and
a second visualization of said response of said robot manipulator instantiation; and
receive input from an operator, and, in response thereto, selectively provide said workcell action and said robot manipulator action; and a programmable logic controller (PLC) comprising:
  a workcell controller module adapted to:
    receive said workcell action from said computing device, and, in response, provide said workcell action to said workcell instantiation; and
    receive said response from said workcell instantiation, and, in response, provide said workcell response to said computing device; and
  a robot manipulator controller module adapted to:
    receive said robot manipulator action from said computing device, and, in response, provide said robot manipulator action to said robot manipulator instantiation; and
    receive said response from said robot manipulator instantiation, and, in response, provide said robot manipulator action to said computing device.

92. The system of claim 91 wherein said robot manipulator simulator is a software component executing on said PLC.

93. An integrated simulation system comprising:
an instantiation of a workcell comprising:
  a workcell simulator adapted to model said workcell and to:
    receive a workcell action;
    provide a simulated workcell response; and
    generate a simulacrum of said workcell;
an instantiation of a robot manipulator comprising:
  a robot manipulator adapted to:
    receive a robot manipulator action; and
    provide a robot manipulator response; and
a computing device adapted to:
  simultaneously display:
    said simulacrum of said workcell instantiation;
    a first visualization of said response of said workcell instantiation; and
    a second visualization of said response of said robot manipulator instantiation; and
  receive input from an operator, and, in response thereto, selectively provide said workcell action and said robot manipulator action; and
a programmable logic controller (PLC) comprising:
  a workcell controller module adapted to:
    receive said workcell action from said computing device, and, in response, provide said workcell action to said workcell instantiation; and
    receive said response from said workcell instantiation, and, in response, provide said workcell response to said computing device; and
  a robot manipulator controller module adapted to:
    receive said robot manipulator action from said computing device, and, in response, provide said robot manipulator action to said robot manipulator instantiation; and
    receive said response from said robot manipulator instantiation, and, in response, provide said robot manipulator response to said computing device.

94. The system of claim 93 wherein said workcell simulator is a software component executing on said PLC.

95. The system of claim 93 wherein said workcell simulator is a software component executing on said computing device.

* * * * *